(12) United States Patent
Zampardi et al.

(10) Patent No.: US 11,282,923 B2
(45) Date of Patent: Mar. 22, 2022

(54) BIPOLAR TRANSISTOR

(71) Applicant: Qorvo US, Inc., Greensboro, NC (US)

(72) Inventors: Peter J. Zampardi, Newbury Park, CA (US); Timothy S. Henderson, Portland, OR (US); Leonard Hayden, Portland, OR (US); Adrian Hutchinson, Portland, OR (US)

(73) Assignee: QORVO US, INC., Greensboro, NC (US)

( * ) Notice: Subject to any disclaimer, the term of this patent is extended or adjusted under 35 U.S.C. 154(b) by 148 days.

(21) Appl. No.: 16/706,931

(22) Filed: Dec. 9, 2019

(65) Prior Publication Data
US 2021/0175328 A1    Jun. 10, 2021

(51) Int. Cl.
*H01L 29/08* (2006.01)
*H01L 29/10* (2006.01)

(52) U.S. Cl.
CPC ...... *H01L 29/0821* (2013.01); *H01L 29/0817* (2013.01); *H01L 29/1004* (2013.01)

(58) Field of Classification Search
CPC ... H01L 29/0817; H01L 27/0711–0722; H01L 27/075–0783; H01L 27/082–0828; H01L 29/04–045; H01L 29/0804–0817; H01L 29/0821–0826; H01L 29/083–0839; H01L 29/1004–1008
See application file for complete search history.

(56) References Cited

U.S. PATENT DOCUMENTS

| | | |
|---|---|---|
| 3,639,815 A | 2/1972 | Emick et al. |
| 3,798,079 A | 3/1974 | Chu et al. |
| 3,872,494 A | 3/1975 | Davis, Jr. et al. |
| 3,964,089 A | 6/1976 | Poon et al. |
| 5,336,926 A | 8/1994 | Matthews |
| 5,581,115 A | 12/1996 | Grubisich et al. |
| 7,012,288 B2 | 3/2006 | Lee et al. |
| 9,054,065 B2 | 6/2015 | Zampardi, Jr. |
| 9,070,732 B2 | 6/2015 | Zampardi, Jr. et al. |

(Continued)

OTHER PUBLICATIONS

Chau, H.-F., et al., "Breakdown-Speed Considerations in AlGaAs/GaAs Heterojunction Bipolar Transistors with Special Collector Designs," IEEE Transactions on Electron Devices, Vo. 39, No. 12, Dec. 1992, pp. 2711-2719.

(Continued)

*Primary Examiner* — Shahed Ahmed
(74) *Attorney, Agent, or Firm* — Withrow & Terranova, P.L.L.C.

(57) ABSTRACT

Disclosed is a transistor having a base, a substrate, and a collector between the substrate and the base. The collector has a first region of a first thickness under the base and is made up of a first dopant type having a substantially constant doping concentration across the first thickness. A second region with a second thickness under the first region is made up of a second dopant type that is different from the first dopant type and has a substantially constant doping concentration across the second thickness. A third region with a third thickness under the second region is made up of the second dopant type with a graded doping concentration that is a function of increasing distance from the second region through the third thickness. An emitter is located over the base opposite the collector.

20 Claims, 2 Drawing Sheets

(56) References Cited

U.S. PATENT DOCUMENTS

| | | | |
|---|---|---|---|
| 9,741,834 | B2 | 8/2017 | Zampardi et al. |
| 2004/0188712 | A1 | 9/2004 | Lee et al. |
| 2013/0285120 | A1* | 10/2013 | Zampardi, Jr. ....... H01L 29/737 257/197 |
| 2013/0285121 | A1* | 10/2013 | Zampardi, Jr ........ H01L 29/365 257/197 |
| 2014/0002188 | A1 | 1/2014 | Chen et al. |
| 2015/0349100 | A1* | 12/2015 | Umemoto ................ H01L 29/20 257/586 |
| 2016/0293700 | A1* | 10/2016 | Zampardi ........... H01L 29/0821 |
| 2019/0115457 | A1* | 4/2019 | Umemoto ......... H01L 21/30612 |

OTHER PUBLICATIONS

Chiu, L. C. et al., "Graded collector heterojunction bipolar transistor," Applied Physics Letters, vol. 44, No. 1, Jan. 1, 1984, pp. 105-106.

Dow, M. et al., "Investigation Into the Survival of Epitaxial Bipolar Transistors in Current Mode Second Breakdown," Electronics Letters, vol. 14, No. 4, Feb. 16, 1978, pp. 100-101.

Gao, G. B., et al., "Current-Induced Breakdown in p-Type Collector AlGaAs/GaAs HBT's," IEEE Transactions on Electron Devices, vol. 37, No. 3, Mar. 1990, pp. 807-810.

Hassani, M. M. Shahidul et al., "Breakdown voltages of base-collector junctions of high-voltage power transistors with graded collectors," International Journal of Electronics, vol. 70, No. 1, 1991, pp. 77-83.

Humphreys, M.J. et al., "Control of Avalanche Injection in Bipolar Transistors Through the use of Graded Collector Impurity Profiles," IEE Proceedings, vol. 134, Pt. I, No. 5, Oct. 1987, pp. 141-147.

Humphreys, M.J. et al., "Some observations on the failure locus of npn transistors and its improvement using graded collector structures," IEE Proceedings, vol. 135, Pt. 1, No. 4, Aug. 1988, pp. 85-90.

Morizuka, K., et al., "Electron Space-Charge Effects on High-Frequency Performance of AlGaAs/GaAs HBT's under High-Current-Density Operation," IEEE Electron Device Letters, vol. 9, No. 11, Nov. 1988, pp. 570-572.

Morizuka, K., et al., "Transit Time Reduction in AlGaAs/GaAs HBT's with p-type Collector," IEEE Transactions on Electron Devices, vol. 35, No. 12, Dec. 1988, pp. 2443-2444.

Ohara, S. et al., "InGaP/GaAs Power HBTs with a Low Bias Voltage," IEDM, 1995, IEEE, pp. 791-794.

Suzuki, S. et al., "A New Approach To Prevent the Burnout Under Mismatching Load Conditions in High Power HBT," 29th European Microwave Conference, 1999, Munich, Germany, pp. 117-120.

Tateno, Y. et al., "3.5V, 1W High Efficiency AlGaAS/GaAs HBTs with Collector Launcher Structure," IEDM, 1994, IEEE, pp. 195-198.

Non-Final Office Action for U.S. Appl. No. 15/083,566, dated Nov. 7, 2016, 8 pages.

Notice of Allowance for U.S. Appl. No. 15/083,566, dated Apr. 26, 2017, 7 pages.

\* cited by examiner

BIPOLAR TRANSISTOR

FIELD OF THE DISCLOSURE

The present disclosure relates to transistors and specifically to bipolar transistors with improved performance and ruggedness.

BACKGROUND

Transistors such as heterojunction bipolar transistors (HBTs) are widely used in many different applications. For example, one or more HBTs may be provided in a power amplifier (PA) for radio frequency (RF) communications circuitry. As RF communications standards continue to evolve, the performance requirements of RF communications circuitry, and in particular those placed on RF PAs, are becoming increasingly stringent. Accordingly, designers are continually striving to improve RF PA performance parameters such as RF gain and linearity.

To improve the performance of HBTs for RF PAs, designers have previously altered a doping profile of a collector in the device. Generally, these improvements have provided an increase in one performance parameter such as linearity while degrading others such as RF gain and ruggedness. As discussed above, modern RF communications standards demand high performance across a range of different performance parameters. Accordingly, there is a need for an improved bipolar transistor device.

SUMMARY

Disclosed is a transistor having a base, a substrate, and a collector between the substrate and the base. The collector has a first region of a first thickness under the base and is made up of a first dopant type having a substantially constant doping concentration across the first thickness. A second region with a second thickness under the first region is made up of a second dopant type that is different from the first dopant type and has a substantially constant doping concentration across the second thickness. A third region with a third thickness under the second region is made up of the second dopant type with a graded doping concentration that is a function of increasing distance from the second region through the third thickness. An emitter is located over the base opposite the collector.

By providing the collector with the doping profile made up of the doping segments as described, the ruggedness of the transistor is significantly improved while maintaining the radio frequency gain thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
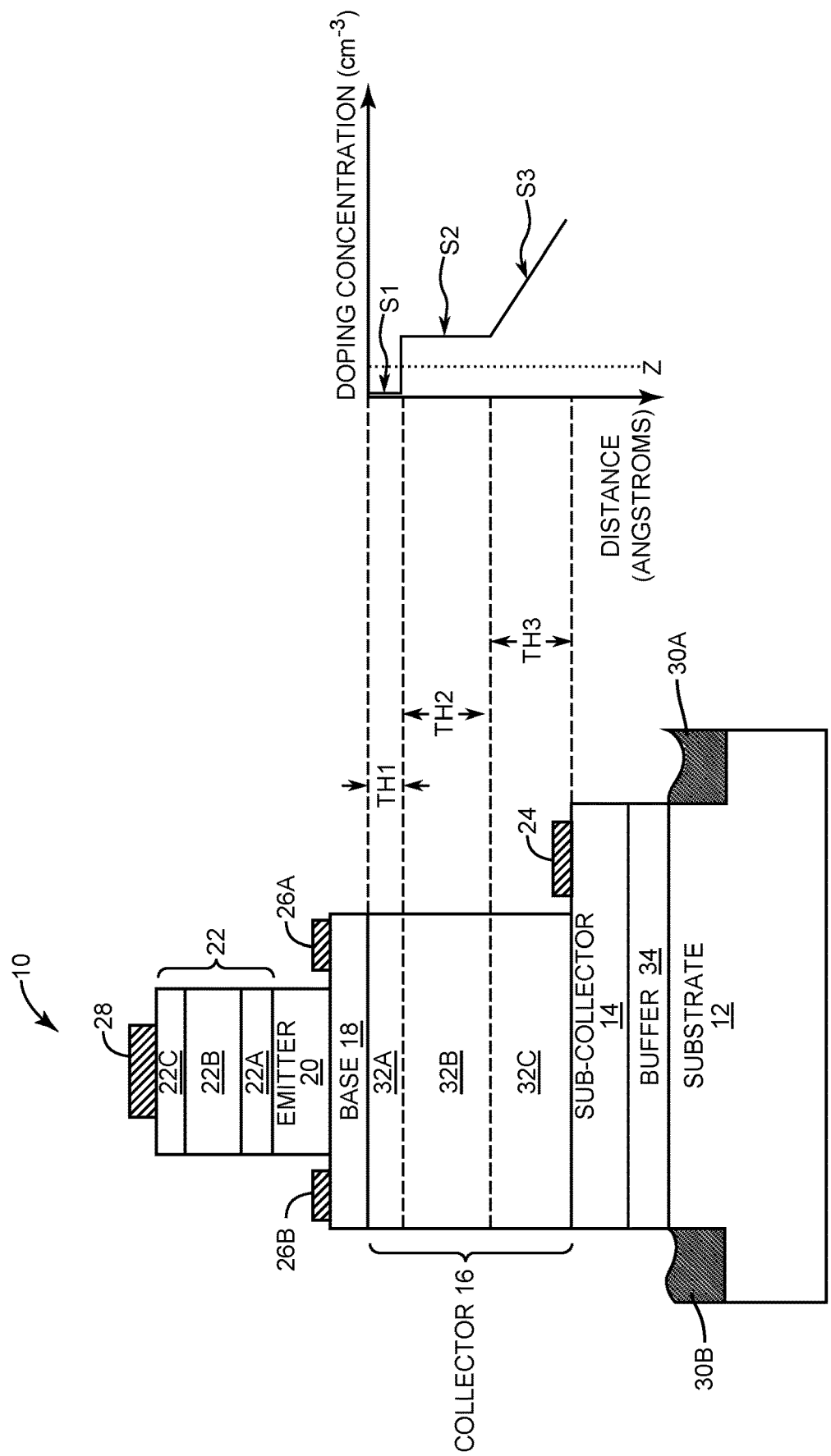
FIG. 1 is a cross-sectional view of an exemplary embodiment of a heterojunction bipolar transistor according to the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. Moreover, unless otherwise defined, substantially constant means a given value remains within ±10% of an average value between a maximum value and a minimum value.

FIG. 1 depicts a cross-section of a heterojunction bipolar transistor 10 that is structured in accordance with one embodiment of the present disclosure. The heterojunction bipolar transistor 10 includes a substrate 12, a sub-collector 14 over the substrate 12, a collector 16 over the sub-collector 14, a base 18 over the collector 16, an emitter 20 over the base 18, and an emitter contact stack 22 over the emitter 20. The heterojunction bipolar transistor 10 is tiered such that the device includes a number of different mesas on which contacts to the various portions of the device are provided. A first mesa on the sub-collector 14 includes a collector contact 24, such that the collector contact 24 is on a surface of the sub-collector 14. A second mesa on the base 18 includes a first base contact 26A and a second base contact 26B, such that the first base contact 26A and the second base contact 26B are on a surface of the base 18. A third mesa on the emitter contact stack 22 on top of the heterojunction bipolar transistor 10 includes an emitter contact 28, such that the emitter contact 28 is on a surface of the emitter contact stack 22. The heterojunction bipolar transistor 10 may be surrounded by a first isolation region 30A and a second isolation region 30B in some embodiments to electrically isolate the heterojunction bipolar transistor 10 from adjacent devices. The emitter contact stack 22 includes an emitter cap layer 22A over the emitter 20, a bottom emitter contact layer 22B over the emitter cap layer 22A, and a top emitter contact layer 22C over the bottom emitter contact layer 22B.

In at least one embodiment, the heterojunction bipolar transistor 10 further includes a buffer 34 between the substrate 12 and the sub-collector 14. The buffer 34 is configured to lower leakage currents from the substrate and to improve immunity to epitaxial defects. In at least one embodiment, the buffer layer is made of aluminum gallium arsenide.

As discussed above, a doping profile of the collector 16 may affect device parameters of the heterojunction bipolar transistor 10 such as linearity, ruggedness, and radio frequency (RF) gain. Previous doping schemes have generally resulted in improvement of one or more of these parameters at the expense of the others. In an effort to simultaneously improve linearity, ruggedness, and RF gain, the collector 16 is vertically divided into a first collector region 32A adjacent to the base 18, a second collector region 32B below the first collector region 32A, and a third collector region 32C below the second collector region 32B and adjacent to the sub-collector 14.

A graph in FIG. 1 illustrates a doping profile made up of doping segments of the first collector region 32A, the second collector region 32B, and the third collector region 32C, respectively. In particular, a first doping segment S1 of the first collector region 32A is flat such that a doping concentration of the first collector region 32A is substantially constant with distance from the base 18. The first collector region 32A has a dopant type, either n-type or p-type, that is the same dopant type as used to dope the base 18. For example, if the base 18 is doped with impurity atoms that make the base 18 a p-type semiconductor, the first collector region 32A is also doped with impurity atoms that make the first collector region 32A a p-type semiconductor. In either case, the base has a dopant concentration that is at least 1E19 $cm^{-3}$. Moreover, some embodiments may have a base layer with composition grading, doping grading, and step doping, and combinations thereof.

A doping of the second collector region 32B has an opposite type of dopant in comparison with the dopant of the first collector region 32A. The second collector region 32B has a second doping segment S2 that is substantially constant with distance from the base 18. However, because the dopant of the second collector region 32B is of the opposite type of dopant of the first collector region 32A, the second doping segment S2 is shown stepped across a zero dopant concentration relative to the first doping segment S1. The zero dopant concentration is depicted by a dashed vertical line that is labeled Z for zero.

A third doping segment S3 of the third collector region 32C is graduated such that a doping concentration of the third collector region 32C decreases in proportion to distance from the sub-collector 14. The type of dopant in the third collector region 32C is the same type of dopant of the second collector region 32B. In some embodiments, the first dopant type is a p-type dopant and the second dopant type is an n-type dopant. In other embodiments, the first dopant type is an n-type dopant and the second dopant type is a p-type dopant.

In an exemplary embodiment of FIG. 1, the doping of the first collector region 32A is p-type. As best seen in greater detail in FIG. 2, a doping concentration for the substantially constant doping profile of the first doping segment S1 of the first collector region 32A has a dopant concentration that is between 1.5E16 $cm^{-3}$ and 2.5E16 $cm^{-3}$. In one embodiment, the doping concentration for the substantially constant doping profile of the first doping segment S1 of the first collector region 32A has a dopant concentration that is between 1.8E16 $cm^{-3}$ and 2.2E16 $cm^{-3}$. This level of doping concentration of the first collector region 32A is at least an order of magnitude lower than a doping concentration of the base 18 that also has p-type doping. Referring to FIG. 1, a first thickness TH1 of the first collector region 32A between the base 18 and the second collector region 32B ranges between 1000 Angstroms and 2000 Angstroms. In one embodiment, the first thickness TH1 between the base 18 and the second collector region 32B ranges between 1350 Angstroms and 1600 Angstroms.

Figure 2:
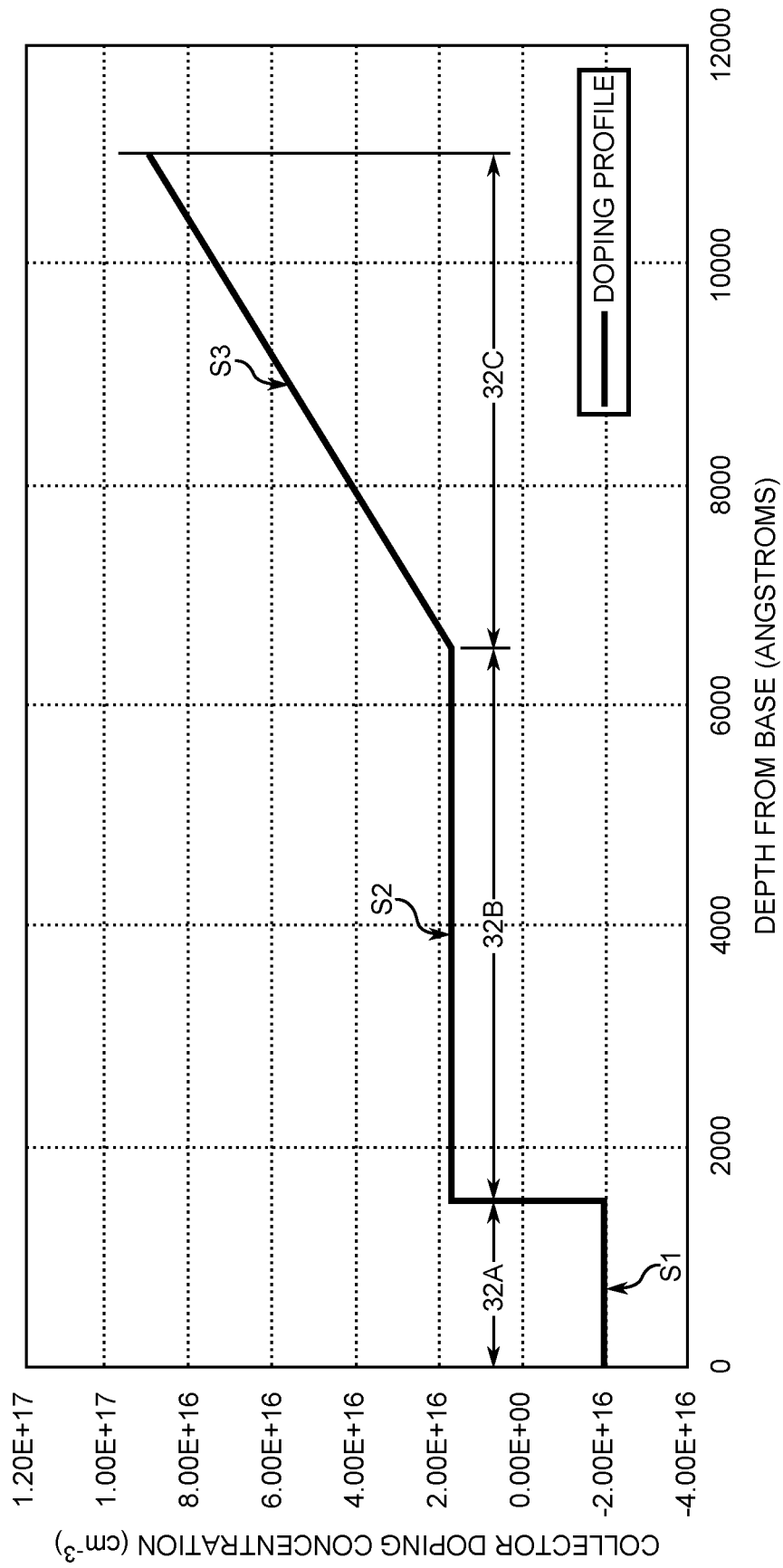
FIG. 2 is a graph of a collector doping profile for the heterojunction bipolar transistor of the exemplary embodiment depicted in FIG. 1.

In contrast to the first collector region 32A, the doping of the second collector region 32B is n-type in this exemplary embodiment. Referring to FIG. 2, a doping concentration of the second doping segment S2 for the second collector region 32B is substantially constant ranging between about 1.0E16 $cm^{-3}$ and 2.0E16 $cm^{-3}$. In one embodiment, the doping concentration for the second collector region 32B is substantially constant ranging between about 1.53E16 $cm^{-3}$ and 1.87E16 $cm^{-3}$. Referring to FIG. 1, a second thickness TH2 of the second collector region 32B between the first collector region 32A and the third collector region 32C ranges between 4000 Angstroms and 6000 Angstroms. In one embodiment, the second thickness TH2 between the first collector region 32A and the third collector region 32C ranges between 4500 Angstroms and 5500 Angstroms.

A third thickness TH3 of the third collector region 32C between the second collector region 32B and the sub-collector 14 ranges between 4500 Angstroms and 5500 Angstroms. In one embodiment, the third thickness TH3 between the second collector region 32B and the sub-collector 14 ranges between 4050 Angstroms and 4950 Angstroms.

Referring to FIG. 2, the doping concentration of the third doping segment S3 of the third collector region 32C increases from a lower value to a higher value as a function of increasing distance through the thickness TH3 from the second collector region 32B to the sub-collector 14. In one embodiment, the lower value of doping concentration is between 1.0E16 $cm^{-3}$ and 2.0E16 $cm^{-3}$ and the higher value of doping concentration is between 7.5E16 $cm^{-3}$ and 10.5E16 $cm^{-3}$. In another embodiment, the lower value of doping concentration is between 1.53E16 $cm^{-3}$ and 1.87E16 $cm^{-3}$ and the higher value of doping concentration is between 8.1E16 $cm^{-3}$ and 9.9E16 $cm^{-3}$. In one embodiment, the doping concentration of the third doping segment S3 increases through the thickness TH3 as a function of increasing distance from the second collector region 32B to the sub-collector 14. In some embodiments, the doping concentration of the third doping segment S3 is a linear function of distance through the thickness TH3 from the second collector region 32B to the sub-collector 14. In other embodiments, the doping concentration of the third doping segment S3 is a non-linear function of distance through the thickness TH3 of the third collector region 32C. Examples of such non-linear functions include but are not limited to exponential functions and power functions having exponents other than 1 and 0. Moreover, a plurality of doping steps that follow to within ±5% of continuous linear and continuous non-linear doping of the third doping segment S3 may be utilized without departing from the principles of the present disclosure.

Notably, the doping profile of the collector 16 and the first thickness TH1 of the first collector region 32A, the second thickness TH2 of the second collector region 32B, and the third thickness TH3 of the third collector region disclosed above are particular well suited for envelope tracking and power amplifier circuitry employed in handheld wireless communications devices. Infrastructure devices such as basestations and enhanced node-Bs may require devices capable of handling greater amounts of power, and thus the thicknesses TH1, TH2, and TH3 may be increased to allow for this increased power handling. Providing the collector 16 as described above improves the linearity of the heterojunction bipolar transistor 10 without sacrificing other performance parameters such as RF gain. In particular, providing the third collector region 32C with a graded doping segment S3 flattens a relationship between a cutoff frequency ($f_T$) of the heterojunction bipolar transistor 10 and a current density thereof. This effectively linearizes the response of the heterojunction bipolar transistor 10, especially when the heterojunction bipolar transistor 10 is provided in power amplifier circuitry along with one or more other heterojunction bipolar transistors. Moreover, the graded doping segment S3 in comparison with the constant doping segment S2 slows an increase in electric field within the collector 16 with increasing current.

In particular, providing the third collector region 32C with the graded doping segment S3 effectively delays base push-out due to the Kirk Effect (by distributing the electric field to prevent reversal of charge in the depletion region when operating the device), which further contributes to the flattening of the cutoff frequency ($f_T$) vs. current density response of the heterojunction bipolar transistor 10 and also prevents a decrease in breakdown voltage in order to increase the ruggedness of the device. As such, the heterojunction bipolar transistor 10 has an increased safe operating area over typical heterojunction transistors.

Those skilled in the art will recognize improvements and modifications to the preferred embodiments of the present disclosure. All such improvements and modifications are considered within the scope of the concepts disclosed herein and the claims that follow.

What is claimed is:

1. A transistor comprising:
    a substrate;
    a base comprised of a first dopant type;
    a collector between the substrate and the base and comprising:
        a first collector region under the base and comprised of the first dopant type having a first doping concentration that is substantially constant;
        a second collector region under the first collector region and comprised of a second dopant type that is different from the first dopant type and having a second doping concentration that is substantially constant;
        a third collector region under the second collector region and comprised of the second dopant type with a third doping concentration that is a function of increasing distance from the second collector region through the third region; and
    an emitter over the base opposite the collector.

2. The transistor of claim 1, wherein the third doping concentration increases linearly as the function of increasing distance from the second collector region through the third collector region.

3. The transistor of claim 2, wherein the function is approximated by a plurality of doping steps that follows to within ±5% of continuous linear doping.

4. The transistor of claim 1, wherein the third doping concentration of the third region increases non-linearly as the function of increasing distance from the second collector region through the third collector region.

5. The transistor of claim 4, wherein the function is approximated by a plurality of doping steps that follows to within ±5% of continuous non-linear doping.

6. The transistor of claim 4, wherein the function is selected from one of exponential functions and power functions having exponents other than 1 and 0.

7. The transistor of claim 1, wherein the first doping concentration of the first collector region is between 1.5E16 $cm^{-3}$ and 2.5E16 $cm^{-3}$.

8. The transistor of claim 1, wherein the second doping concentration of the second collector region is between about 1.0E16 $cm^{-3}$ and 2.0E16 $cm^{-3}$.

9. The transistor of claim 1, wherein the third doping concentration of the third collector region increases from a lower value to a higher value as a function of increasing distance from the second collector region through the third collector region, wherein the lower value of doping concentration is between 1.0E16 $cm^{-3}$ and 2.0E16 $cm^{-3}$ and the higher value of doping concentration is between 7.5E16 $cm^{-3}$ and 10.5E16 $cm^{-3}$.

10. The transistor of claim 1, wherein the first collector region has a thickness between 1000 Angstroms and 2000 Angstroms.

11. The transistor of claim 1, wherein the second collector region has a thickness between 4000 Angstroms and 6000 Angstroms.

12. The transistor of claim 1, wherein the third collector region has a thickness between 4500 Angstroms and 5500 Angstroms.

13. The transistor of claim 1, wherein the transistor is a heterojunction bipolar transistor (HBT).

14. The transistor of claim 1, further comprising a sub-collector between the collector and the substrate.

15. The transistor of claim 14, further comprising an aluminum gallium arsenide buffer layer between the sub-collector and the substrate.

16. The transistor of claim 1, wherein the first dopant type is a p-type dopant and the second dopant type is an n-type dopant.

17. The transistor of claim 1, wherein the first dopant type is an n-type dopant and the second dopant type is a p-type dopant.

18. The transistor of claim 1, wherein the base has a dopant concentration that is at least $1E19$ $cm^{-3}$.

19. The transistor of claim 1 wherein,
the first doping concentration of the first collector region is between $1.5E16$ $cm^{-3}$ and $2.5E16$ $cm^{-3}$;
the second doping concentration of the second collector region is between $1.5E16$ $cm^{-3}$ and $2.5E16$ $cm^{-3}$; and
the third doping concentration of the third collector region increases from a lower value to a higher value as a function of increasing distance from the second collector region through the third collector region, wherein the lower value of doping concentration is between $1.0E16$ $cm^{-3}$ and $2.0E16$ $cm^{-3}$ and the higher value of doping concentration is between $7.5E16$ $cm^{-3}$ and $10.5E16$ $cm^{-3}$.

20. The transistor of claim 1 wherein,
the first collector region has a thickness between 1000 Angstroms and 2000 Angstroms;
the second collector region has a thickness between 4000 Angstroms and 6000 Angstroms; and
the third collector region has a thickness between 4500 Angstroms and 5500 Angstroms.

* * * * *